United States Patent [19]

Disko

[11] Patent Number: 5,006,919
[45] Date of Patent: Apr. 9, 1991

[54] INTEGRATED CIRCUIT PACKAGE

[75] Inventor: David Disko, Austin, Tex.

[73] Assignee: Advanced Micro Devices, Inc., Sunnyvale, Calif.

[21] Appl. No.: 487,600

[22] Filed: Mar. 1, 1990

[51] Int. Cl.$^5$ .................. H01L 23/28; H01L 23/48; H01L 29/44; H01L 29/52

[52] U.S. Cl. ........................ 357/72; 357/70; 357/74; 357/80

[58] Field of Search .............. 357/70, 72, 74, 80; 174/52.2, 52.4; 361/392, 421

[56] References Cited

U.S. PATENT DOCUMENTS 4,534,105 8/1985 Reusch .................................. 29/589
4,714,952 12/1987 Takekawa et al. ................. 357/75

Primary Examiner—Rolf Hille
Assistant Examiner—D. M. Ostrowski

[57] ABSTRACT

There is disclosed an integrated circuit package assembly for housing an integrated circuit die wherein the integrated circuit package assembly affords substantially reduced ground bounce within the integrated circuit. The package assembly includes a planar electrically conductive sheet upon which the integrated circuit die is insulatively bonded. The integrated circuit package includes at least one ground lead which is coupled to a conductive ground pad on the integrated circuit by a first ground wire which connects the ground pad to the electrically conductive sheet and a second bond wire which connects the electrically conductive sheet to the ground lead. The assembly is completed by an encapsulation which encapsulates the integrated circuit die, the electrically conductive sheet, the first and second bond wires, and a portion of the ground lead.

10 Claims, 2 Drawing Sheets

INTEGRATED CIRCUIT PACKAGE

BACKGROUND OF THE INVENTION

The present invention generally relates to integrated circuits and more particularly to an improved integrated circuit package which is cost effective and which reduces ground bounce in the integrated circuit when operated.

As is well known, an integrated circuit is formed on a small, substantially planar, piece of semiconductor, such as silicon, known as a die. The die, in addition to the circuits formed therein, includes connection pads on the top surface at the periphery thereof. Before an integrated circuit is ready for use, the die is encapsulated in an insulating package which generally includes a lead frame having a plurality of leads extending externally from the package. The leads are internally connected to corresponding connection pads to permit the integrated circuit die to be coupled to the outside world.

At least one connection pad and a corresponding lead are reserved for a ground connection and at least one connection pad and a corresponding lead are reserved for a supply voltage connection. Such a ground and supply voltage connection are required to permit an operating power supply voltage to be applied to the die.

In the past, and with respect to less expensive, high volume, integrated circuits, the dies have been encapsulated in an insulating housing referred to as a plastic quad flat pack through injection molding and wherein the dies are conductively bonded to a metallic surface. The metallic surface is employed to distribute the power supply voltage applied to the power supply lead and die pad. The ground connection for the dies is established only through the ground leads and pads. Such grounding is generally sufficient in such high volume integrated circuits since such high volume integrated circuits are generally low performance integrated circuits wherein a minimal amount of internal device switching occur in the operation of such integrated circuits.

There are, however, a significant number of high performance integrated circuits such as microprocessor integrated circuits wherein a high degree of internal device switching occurs. Such high performance integrated circuits generally require a better or harder ground than the aforementioned integrated circuits which are encapsulated in the aforementioned plastic quad flat pack packages. This results because the device switching in high performance integrated circuits causes voltage transients which in turn cause what is known as ground bounce wherein the ground voltage is not at zero volts but rather at some finite voltage.

Integrated circuits, such as microprocessor integrated circuits, are generally able to operate properly if the ground bounce is maintained below an acceptable level, such as, for example, 1 volt. When the ground bounce is above the acceptable level, threshold levels of the switching devices can be adversely affected causing the high performance integrated circuits to operate improperly.

In order to cope with the ground bounce problem in high performance integrated circuits, such as microprocessor integrated circuits, extreme measures have been previously taken to maintain the ground bounce below the acceptable limit, of, for example, 1 volt. For example, integrated circuit packages have been employed which are formed from ceramic and include multiple laminations of ceramic and conductive ground planes below the integrated circuit die to sink current and disperse the transient voltages and currents. While such packages are capable of maintaining the ground bounce below the acceptable limits, such as 1 volt, the cost of such packaging has been on the order of ten times the cost of the previously mentioned plastic quad flat pack packages. Plastic quad flat pack packages are not a viable alternative because use of such packages for high performance integrated circuits has been shown to result in a ground bounce which is greater than the acceptable limit, of, for example, 1 volt, and more particularly, in the unacceptable range on the order of 2.5 volts.

The packaging costs of ceramic packages of the type described above have represented a significant portion of the overall costs of high performance integrated circuits. Hence, a significant cost reduction in high performance integrated circuits can therefore be realized with an improved package which represents less manufacturing cost while maintaining the ground bounce within acceptable limits such as, for example, 1 volt or less.

SUMMARY OF THE INVENTION

The present invention therefore provides an improved integrated circuit package assembly for housing an integrated circuit die of the type having a substantially planar bottom surface, a substantially planar top surface, and a plurality of connection pads disposed on the top surface wherein at least one of the connection pads is a ground connection pad. The integrated circuit package assembly affords substantially reduced ground bounce within the integrated circuit and comprises a sheet of substantially planar electrically conductive material, electrically insulating bonding means bonding the integrated circuit die bottom surface to the sheet of electrically conductive material and a plurality of electrically conductive leads extending laterally from the integrated circuit die, wherein at least one of the leads is a ground lead. The integrated circuit package assembly further includes first bond wire means connecting the integrated circuit die ground connection pad to the sheet of electrically conductive material, second bond wire means connecting the sheet of electrically conductive material to the ground lead, and means for encapsulating the integrated circuit die, the sheet of electrically conductive material, the first and second bond wires, and a portion of the electrically conductive leads.

The invention further provides an improved integrated circuit package assembly for housing an integrated circuit die of the type having a substantially planar bottom surface, a substantially planar top surface, and a plurality of connection pads disposed on the periphery of the top surface, wherein a plurality of the connection pads are ground connection pads. The integrated circuit package assembly affords substantially reduced ground bounce within the integrated circuit and comprises a sheet of substantially planar electrically conductive material, the sheet having a surface area greater than the surface area of the integrated circuit die bottom surface, an electrically insulating adhesive for bonding the integrated circuit die bottom surface to the sheet of electrically conductive material, and wherein the die is arranged on the sheet to form an exposed surface area of the sheet of electrically conductive material. The integrated circuit package assembly further includes a plurality of electrically conductive leads extending laterally from the integrated circuit, wherein the leads include a plurality of ground leads, a first set of bond wires connecting the integrated circuit die ground connection pads to the exposed surface area of the sheet of electrically conductive material, a second set of bond wires connecting the exposed surface area of the sheet of electrically conductive material to the ground leads, a third set of bond wires connecting the integrated circuit die non-ground connection pads to the non-ground leads, and means for encapsulating the integrated circuit die, the sheet of electrically conductive material, the first and second and third sets of bond wires, and a portion of each of the electrically conductive leads.

BRIEF DESCRIPTION OF THE DRAWINGS

The features of the present invention which are believed to be novel are set forth with particularity in the appended claims. The invention, together with further advantages and objects thereof, may best be understood by making reference to the following description taken in conjunction with the accompanying drawings, in the several figures of which like reference numerals identify identical elements, and wherein:

DESCRIPTION OF THE PREFERRED EMBODIMENT

Figure 1:
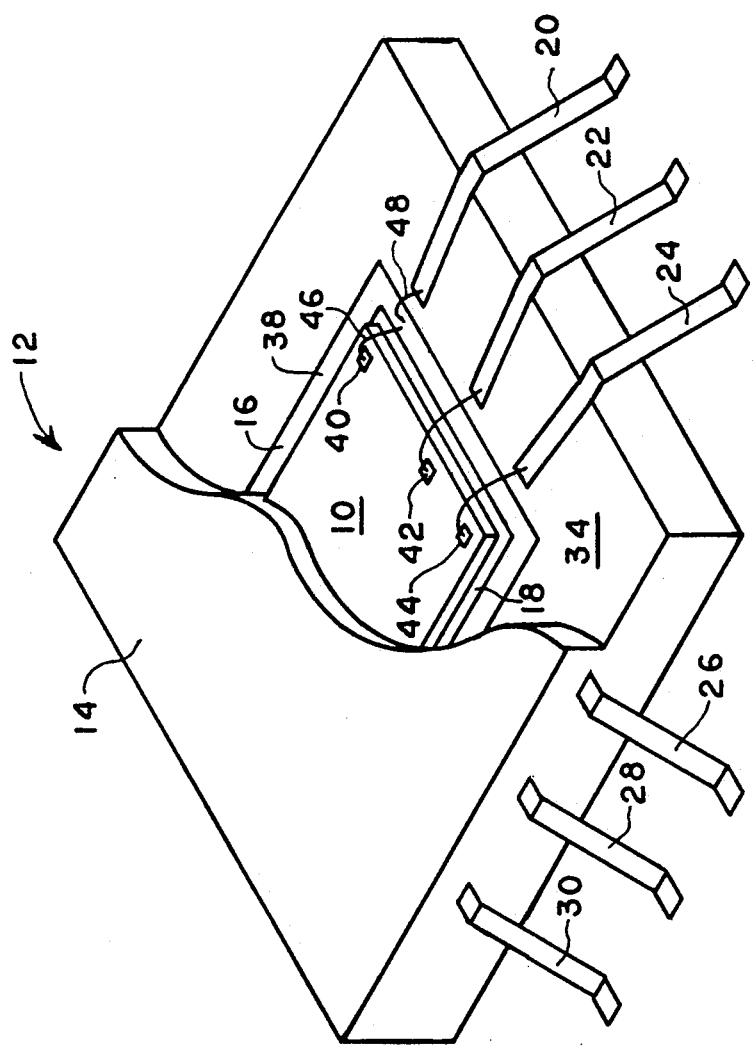
FIG. 1 is a perspective view with a portion cut away of an integrated circuit device including an integrated circuit package assembly embodying the present invention.

Referring now to the Figures, an integrated circuit die 10 of an integrated circuit device 12 is shown encapsulated within an integrated circuit package assembly 14 embodying the present invention. The integrated circuit package assembly generally includes a sheet of substantially planar electrically conductive material 16, an electrically insulating bonding material 18, a plurality of electrically conductive leads, 20, 22, 24, 26, 28, 30 and 32, and an encapsulation 34.

Figure 2:
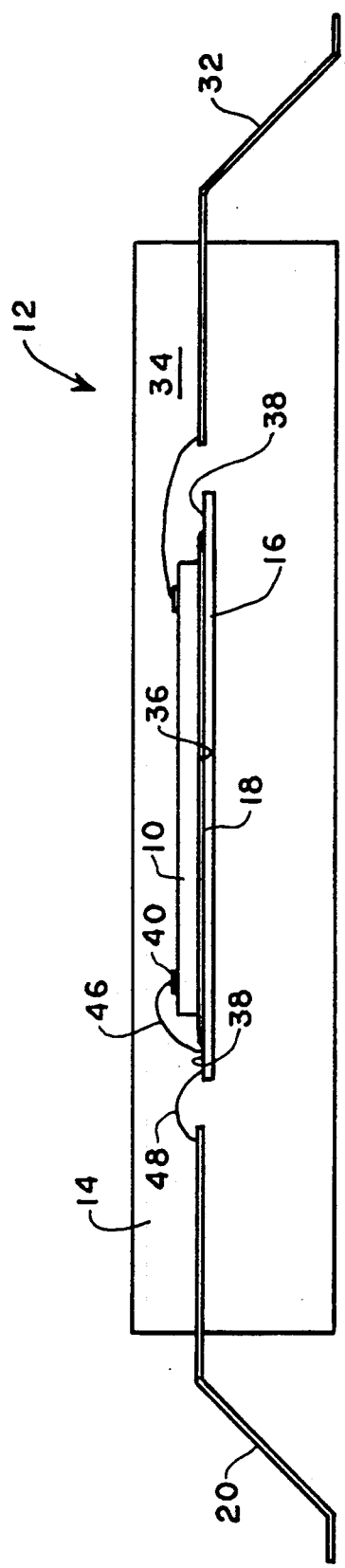
FIG. 2 is a side sectional view of the integrated circuit device of FIG. 1.

As can be clearly noted in FIGS. 1 and 2, the surface area of the electrically conductive material 16 is greater than the surface area of the integrated circuit die 10. The integrated circuit die 10 is bonded to the electrically conductive material 16 at its bottom surface 36 by the electrically insulating bonding material. In practicing the present invention, the bonding material 18 may be AMICON-401, manufactured by AMICON, Inc. This bonding material is an insulating epoxy which serves to insulate the die 10 from the electrically conductive planar material 16. Since the surface area of the conductive material 16 is greater than the surface area of the die 10, there remains exposed surface portions 38 of the electrically conductive material 16 about the periphery of the die 10.

The electrically conductive leads 20, 22, 24, 26, 28, 30 and 32 extend laterally from the integrated circuit die 10. One such lead 20 comprises a ground lead to enable a ground connection to the integrated circuit die 10. While one such ground lead is illustrated in the Figures, additionally ground leads may be provided in accordance with the present invention. For purposes of this preferred embodiment, the other leads 22, 24, 26 28, 30 and 32 may be utilized for making other types of connections to the integrated circuit die 10 such as at least one power supply voltage connection.

As can best be seen in FIG. 1, the integrated circuit die 10 further includes a plurality of connection pads 40, 42 and 44. Connection pad 40 serves as a ground connection pad of the integrated circuit die 10. The ground connection pad 40 is coupled to the ground lead 20 through a first bond wire 46 and a second bond wire 48. The first bond wire 46 connects the ground connection pad 40 to the exposed surface 38 of the electrically conductive sheet 16. The second bond wire 48 connects the exposed area 38 of the electrically conductive sheet 16 to the ground lead 20. Where more than one ground connection pad is provided and more than one ground lead is correspondingly provided, each such additional ground pad and ground lead may be coupled together in the same manner. In such a case, the ground leads which connect the ground pads to the exposed surface area of the electrically conductive sheet 16 form a first set of bond wires and the bond wires which connect the exposed area 38 of the electrically conductive sheet 16 to the ground leads form a second set of bond wires.

The encapsulation 14 preferably is formed of a plastic material, such as the plastic material generally used in forming the previously mentioned plastic quad flat pack packages. After the integrated circuit die 10 is bonded to the electrically conductive sheet 16 and the leads 20 through 32 are connected to the corresponding integrated circuit die pads by bond wires, the assembly thus far assembled is placed into an injection mold wherein the encapsulation 34 is injected into the mold. After the injection molding process is completed, the completed integrated circuit device 12 is removed from the mold so that the encapsulation 34 now encapsulates the integrated circuit die 10, the sheet of electrically conductive material 16, all of the bond wires, and a portion of the electrically conductive leads 20 through 32. Those portions of the leads 20 through 32 which are left exposed are available for providing external connections to the integrated circuit die 10.

The integrated circuit package assembly of the present invention provides a cost effective alternative to the previously used ceramic packages. For example, a packaging assembly formed in accordance with the embodiment of FIGS. 1 and 2 for a high performance microprocessor integrated circuit which exhibits a ground bounce of 700 millivolts with the more expensive ceramic package has exhibited a ground bounce of 900 millivolts with the package assembly of FIGS. 1 and 2. This represents a considerable cost savings in as much as the new and improved package assembly represents a manufacturing cost of only about 10% more than the inexpensive plastic quad flat pack packages. As previously mentioned, the ceramic packages have represented a manufacturing cost of 10 times that of the plastic quad flat pack packages. As a result, the packaging assembly of the present invention maintains an acceptable ground bounce for such a high performance integrated circuit device while its cost of manufacture represents about 1/10th the cost of the previous ceramic packages. Hence, the packaging assembly of the instant invention is capable of providing a cost effective alternative to the previously employed ceramic packaging assemblies used in connection with high performance integrated circuits, such as, microprocessor integrated circuits.

The integrated circuit package assembly of the instant invention is also compatible with present state of the art manufacturing techniques. For example, the same injection molding processes used in forming the previously mentioned plastic quad flat pack packages may be utilized to form the encapsulation 34 of the integrated circuit packaging assembly of the instant invention. In addition, the leads 20 through 32 may be formed from existing materials and conventional thermal compression bonding may be utilized as well for electrically bonding the bond wires to the integrated circuit die connection pads, the exposed surface areas of the electrically conductive sheet of material 16, and the leads 20 through 32.

While a particular embodiment of the present invention has been shown and described, modifications may be made, and it is therefore intended to cover in the appended claims all such changes and modifications which fall within the true spirit and scope of the invention.

What is claimed is:

1. An integrated circuit package assembly for housing an integrated circuit die of the type having a substantially planar bottom surface, a substantially planar top surface, and a plurality of connection pads disposed on said top surface, wherein said connection pads include at least one ground connection pad, said integrated circuit package assembly affording substantially reduced ground bounce within said integrated circuit and comprising:
   a sheet of substantially planar electrically conductive material;
   electrically insulating bonding means for bonding said integrated circuit die bottom surface directly to said sheet of electrically conductive material;
   a plurality of electrically conductive leads extending laterally from said integrated circuit die, said leads including at least one ground lead and a plurality of non-ground conductive leads;
   first bond wire means connecting said integrated circuit die ground connection pad to said sheet of electrically conductive material;
   second bond wire means connecting said sheet of electrically conductive material to said ground lead;
   third bond wire means connecting said non-ground connection pads to said non-ground conductive leads; and
   encapsulation means for encapsulating said integrated circuit die, said sheet of electrically conductive material, said first, second and third bond wire means, and a portion of each said electrically conductive leads, said encapsulation means being formed from electrically insulating material and being immediately adjacent said sheet of electrically conductive material.

2. An integrated circuit package assembly as defined in claim 1 wherein said sheet of electrically conductive material has a surface area greater than the surface area of said integrated circuit die bottom surface and wherein said die is arranged on said sheet of conductive material to expose a surface area portion of said sheet of electrically conductive material.

3. An integrated circuit package assembly as defined in claim 2 wherein said first bond wire means connects said ground pad to said exposed surface area portion of said sheet of electrically conductive material.

4. An integrated circuit package assembly as defined in claim 3 wherein said second bond wire means connects said exposed surface area portion to said ground lead.

5. An integrated circuit package assembly as defined in claim 4 wherein said exposed surface area portion includes at least two surface portions of said sheet on opposite side of said integrated circuit die.

6. An integrated circuit package assembly as defined in claim 2 wherein said integrated circuit die includes a plurality of said ground pads and wherein said first bond wire means comprise a corresponding plurality of bond wires for connecting each said ground pad to said exposed surface portion of said electrically conductive sheet.

7. An integrated circuit package assembly as defined in claim 2 wherein said conductive leads include a plurality of ground leads and wherein said second bond wire means comprises a corresponding plurality of bond wires for connecting said exposed surface portion of said electrically conductive sheet to said ground leads.

8. An integrated circuit package assembly as defined in claim 7 wherein said exposed surface area portion of said sheet includes a marginal surface portion extending around the periphery of said integrated circuit die.

9. An integrated circuit package assembly as defined in claim 1 wherein said sheet of electrically conductive material is formed from metal.

10. An integrated circuit package assembly for housing an integrated circuit die of the type having a substantially planar bottom surface, a substantially planar top surface, and a plurality of connection pads disposed on the periphery of said top surface, wherein a plurality of said connection pads are ground connection pads and a plurality of said connection pads are non-ground connection pads, said integrated circuit package assembly affording substantially reduced ground bounce within said integrated circuit and comprising:
   a sheet of substantially planar electrically conductive material, said sheet having a surface area greater than the surface area of said integrated circuit die bottom surface;
   an electrically insulating adhesive for bonding said integrated circuit die bottom surface to said sheet of electrically conductive material, said die being arranged on said sheet to form an exposed surface area of said sheet of electrically conductive material;
   a plurality of electrically conductive leads extending laterally from said integrated circuit die, said leads including a plurality of ground leads and a plurality of non-ground leads;
   a first set of bond wires connecting said integrated circuit die ground connection pads to said exposed surface area of said sheet of electrically conductive material;
   a second set of bond wires connecting said exposed surface area of said sheet of electrically conductive material to said ground leads;
   a third set of bond wires connecting said non-ground connection pads to said non-ground leads;
   encapsulation means for encapsulating said integrated circuit die, said sheet of electrically conductive material, said first and second set of bond wires, and a portion of each said electrically conductive leads, said encapsulation means being formed from electrically insulating material and being immediately adjacent said sheet of electrically conductive material.

* * * * *